(12) United States Patent
Tay

(10) Patent No.: US 8,441,052 B2
(45) Date of Patent: May 14, 2013

(54) COLOR-OPTIMIZED IMAGE SENSOR

(76) Inventor: Hiok Nam Tay, Singapore (SG)

( * ) Notice: Subject to any disclaimer, the term of this patent is extended or adjusted under 35 U.S.C. 154(b) by 225 days.

(21) Appl. No.: 12/906,351

(22) Filed: Oct. 18, 2010

(65) Prior Publication Data
US 2011/0089514 A1   Apr. 21, 2011

Related U.S. Application Data

(60) Provisional application No. 61/253,849, filed on Oct. 21, 2009, provisional application No. 61/254,745, filed on Oct. 25, 2009.

(51) Int. Cl.
H01L 27/14 (2006.01)

(52) U.S. Cl.
USPC .......... 257/294; 257/461; 257/E27.135; 257/E31.127; 257/432; 257/89; 438/70

(58) Field of Classification Search ..... 438/70; 257/430, 257/E31.121, E27.134, E27.135, E27.142, 257/294, 89
See application file for complete search history.

(56) References Cited

U.S. PATENT DOCUMENTS

| | | | |
|---|---|---|---|
| 6,504,193 B1 * | 1/2003 | Ishiwata et al. | 257/291 |
| 2003/0081895 A1 | 5/2003 | Roy et al. | |
| 2003/0216018 A1 * | 11/2003 | Yamada et al. | 438/585 |
| 2004/0161868 A1 | 8/2004 | Hong | |
| 2005/0236553 A1 | 10/2005 | Noto et al. | |
| 2006/0172450 A1 * | 8/2006 | Tazoe et al. | 438/57 |
| 2007/0023799 A1 | 2/2007 | Boettiger | |
| 2008/0036024 A1 * | 2/2008 | Hwang et al. | 257/432 |
| 2008/0290441 A1 | 11/2008 | Hsu et al. | |
| 2009/0101949 A1 | 4/2009 | Back et al. | |
| 2010/0128155 A1 * | 5/2010 | Ahn et al. | 348/308 |
| 2011/0032405 A1 * | 2/2011 | Nozaki et al. | 348/308 |

FOREIGN PATENT DOCUMENTS

| | | |
|---|---|---|
| EP | 1017107 A2 | 7/2000 |
| EP | 1562233 A2 | 8/2005 |

OTHER PUBLICATIONS

PCT/IB2010/054779 ISR.

* cited by examiner

Primary Examiner — Michelle Mandala
Assistant Examiner — Shaka White

(57) ABSTRACT

An image sensor pixel array includes a photoelectric conversion unit that has a second region in a substrate and vertically below a gate electrode of a transistor. A first region under a top surface of the substrate and above the second region supports a channel of the transistor. A color filter transmits a light via a light guide, the gate electrode and the first region to generate carriers collected by the second region. The gate electrode may be made thinner by a wet etch. An etchant for thinning the gate electrode may be introduced through an opening in an insulating film on the substrate. The light guide may be formed in the opening after the thinning. An anti-reflection stack may be formed at a bottom of the opening prior to forming the light guide.

24 Claims, 7 Drawing Sheets

COLOR-OPTIMIZED IMAGE SENSOR

CROSS-REFERENCE TO RELATED APPLICATIONS

This application claims priority to U.S. Provisional Patent Application No. 61/253,849 filed on Oct. 21, 2009 and U.S. Provisional Patent Application No. 61/254,745 filed on Oct. 25, 2009.

BACKGROUND OF THE INVENTION

1. Field of the Invention

The subject matter disclosed generally relates to structures and methods for fabricating solid state image sensors.

2. Background Information

Photographic equipment such as digital cameras and digital camcorders may contain electronic image sensors that capture light for processing into still or video images. Electronic image sensors typically contain millions of light capturing elements such as photodiodes.

Solid state image sensors can be either of the charge coupled device (CCD) type or the complimentary metal oxide semiconductor (CMOS) type. In either type of image sensor, photo sensors are formed in a substrate and arranged in a two-dimensional array. Image sensors typically contain millions of pixels to provide a high-resolution image.

FIG. 1 shows a sectional view of a prior art solid-state image sensor 1 showing adjacent pixels in a CMOS type sensor, reproduced from U.S. Pat. No. 7,119,319. Each pixel has a photoelectric conversion unit 2. Each conversion unit 2 is located adjacent to a transfer electrode 3 that transfers charges to a floating diffusion unit (not shown). The structure includes wires 4 embedded in an insulating layer 5. The sensor typically includes a flattening layer 6 below the color filter 8 to compensate for top surface irregularities due to the wires 4, since a flat surface is essential for conventional color filter formation by lithography. A second flattening layer 10 is provided above the color filter 8 to provide a flat surface for the formation of microlens 9. The total thickness of flattening layers 6 and 10 plus the color filter 8 is approximately 2.0 um.

Light guides 7 are integrated into the sensor to guide light onto the conversion units 2. The light guides 7 are formed of a material such as silicon nitride that has a higher index of refraction than the insulating layer 5. Each light guide 7 has an entrance that is wider than the area adjacent to the conversion units 2. The sensor 1 may also have a color filter 8 and a microlens 9.

BRIEF SUMMARY OF THE INVENTION

According to a first aspect, the present invention relates to an image sensor supported by a substrate of a first conductivity type, comprising a first pixel configured to detect a blue light and a second pixel, where the second pixel comprises (a) a photodetector that comprises a second region of a second conductivity type in the substrate, (b) a first region of the first conductivity type being vertically above the second region and under a top interface of the substrate, (c) a first drain of a first transistor, the first drain abutting the first region, (d) a first gate of the first transistor, the first gate being vertically above the first and second regions, (e) a first color filter, the first color filter being a red color filter or a green color filter or a yellow color filter, and (f) a first light guide, the first light guide being configured to transmit a light from the first color filter to the second region via the first gate and the first region. More particularly, the first light guide uses total internal reflection at its sidewalls to prevent the light from exiting laterally. Also more particularly, the first pixel comprises (a) a second color filter, the second color filter being a blue color filter or a magenta color filter, and (b) a second light guide configured to transmit light from the second color filter to the substrate mostly without passing through a gate of a transistor.

In the first aspect, the first transistor may be a select switch or a reset switch or an output transistor. Alternately, the first transistor may be a transfer gate.

In the first aspect, it is desirable that the first gate has a thickness between 200 Angstroms and 1,000 Angstroms. It is more desirable that the first gate has a thickness between 300 Angstroms and 700 Angstroms. It is even more desirable that the first gate has a thickness within 500+/−50 Angstroms.

In the first aspect, it is desirable that the first gate is thinner than a gate of a transistor in an ADC in the image sensor.

In the first aspect, it is desirable that the first region is not deeper than 0.8 um in the substrate where the first color filter is a red color filter, and is not deeper than 0.5 um in the substrate if the first color filter is a green color filter or a yellow color filter. It is more desirable that the first region is not deeper than 0.5 um in the substrate where the first color filter is a red color filter, and is not deeper than 0.35 um in the substrate if the first color filter is a green color filter or a yellow color filter.

In the first aspect, it is desirable that the first light guide is on the first gate.

In the first aspect, the first conductivity type may be p-type and the second conductivity type may be n-type.

According to a second aspect, the present invention relates to a method for forming a pixel array of an image sensor supported by a substrate of a first conductivity type, comprising (A) forming a second region of a second conductivity type in the substrate, (B) forming a first region of the first conductivity in the substrate and vertically above the second region, (C) forming a drain of a transistor in the substrate, the drain abutting the first region, (D) forming a gate of the transistor above the substrate, the gate being vertically above the first region and adjacent to the drain; (E) forming a color filter, the color filter being a red color filter or a green color filter or a yellow color filter, and (F) forming a light guide, the light guide being configured to transmit a light from the color filter to the second region via the gate and the first region.

In the second aspect, it is desirable that the method comprises thinning the gate. It is further desirable that, after the thinning, the gate has a thickness between 200 Angstroms and 1,000 Angstroms. It is more further desirable that, after the thinning, the gate has a thickness between 300 Angstroms and 700 Angstroms. It is even more further desirable that, after the thinning, the gate has a thickness within 500+/−50 Angstroms. It is also further desirable that the gate is thinned by an etching in which an etchant is introduce through an opening in and through an insulation film over the gate, the light guide being subsequently formed in the opening. It is even further desirable that the gate is thinned by an etching in which an etchant is introduce through an opening through an insulation film over the gate, the light guide being subsequently formed in the opening. It is still even further desirable that the method further comprises forming an anti-reflection stack in the opening after the thinning and before forming the light guide. It is desirable that the opening is opened with a plasma etch first then followed by a wet etch.

In the second aspect, it is desirable that the gate is thinned using a wet etch.

In the second aspect, it is desirable that the light guide is on the gate.

In the second aspect, it is desirable that the first conductivity type is p-type and the second conductivity type is n-type.

BRIEF DESCRIPTION OF THE DRAWINGS

FIG. 4A is an illustration of a primary color Bayer pattern;

FIG. 4B is an illustration of a green and magenta color filter pattern;

LIST OF REFERENCE SIGNS

Figure 7:
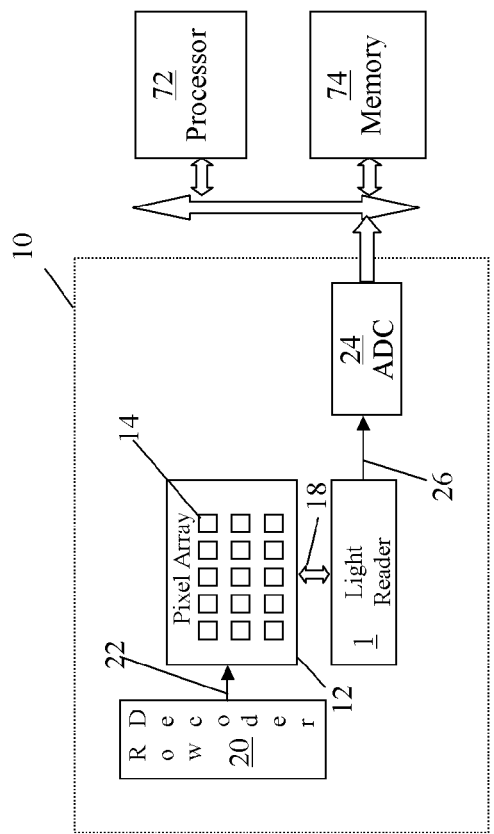
FIG. 7 is a schematic of an image sensor.
Figure 1:
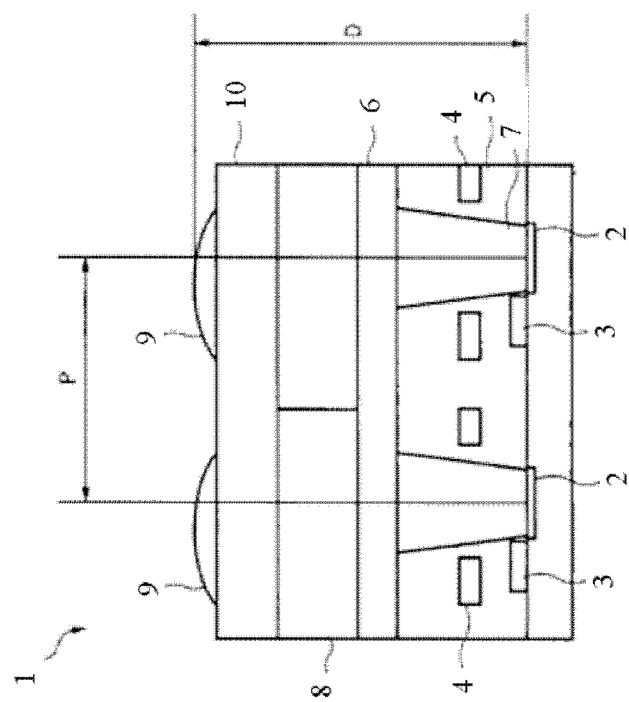
FIG. 1 is an illustration showing a cross-section of two image sensor pixels of the prior art.

106=lightly doped substrate (may be p-epi)
316=lower light guide (may comprise silicon nitride)
130=upper light guide (may comprise silicon nitride)
110=insulator (e.g. silicon oxide)
111=insulator (may be a silicon oxide that further comprises boron and/or phosphorus)
107=first metal (lowest metal wiring layer)
108=second metal
109=contact (diffusion contact or poly contact)
104a=gate electrode of a transfer gate beside a light guide (may be a polysilicon gate)
104b=gate electrode of a transfer gate below a light guide (may be a polysilicon gate)
104c, 104d=gate electrode of a transistor that is not a transfer gate (may be a polysilicon gate)
114a=a blue color filter or a magenta
114b=a red color filter or a green color filter or a yellow color filter that transmits light to second reg 102b via gate electrode 104b or 104d.
120=opening in the insulation film 110 above gate electrode 104b, 104d
230=anti-reflection layer (may comprise three films: two oxide films sandwiching a nitride film)
231=gate oxide
233=nitride liner
235=gate spacer
232=third anti-reflection film (may be a silicon oxide)
234=second anti-reflection film (may be a silicon nitride)
236=top anti-reflection film (may be a silicon oxide)
52x=Pwell under a non-transfer-gate transistor (e.g. a reset switch or a select switch or an output transistor)
52y=first region (medium doped p-region under a transfer gate)
52z=Pwell under a non-transfer-gate transistor (e.g. a reset switch or a select switch or an output transistor) having a photodiode below
53=surface p+ diffusion layer
55=trench isolation region
57=source/drain n+ diffusion
64=barrier region (may be medium doped p-region)
102a=second region of a photodiode receiving light from the color filter 114a (may be medium doped n-regions)
102b=second region of a photodiode receiving light from the color filter 114b (may be medium doped n-regions) (102a together with its surrounding p-regions forms a photodiode. Likewise 102b.)
103a=a center of a horizontal cross-section at a bottom of the second region 102a.
103b=a center of a horizontal cross-section at a bottom of the second region 102b.
168a=depletion region surrounding the second region 102a.
168b=depletion region surrounding the second region 102b.

DETAILED DESCRIPTION

An image sensor pixel array that includes a photoelectric conversion unit supported by a substrate of a first conductivity type. The photoelectric conversion unit may be a photodiode that comprises a second region of a second conductivity type disposed in the substrate and vertically below a gate electrode of a transistor. A first region of the first conductivity and under a top surface of the substrate is disposed above the second region. The first region supports a channel of the transistor. A color filter transmits a light that penetrates through the gate electrode and the first region to generate carriers to be collected by the second region. The color filter may be a red color filter or a green color filter or a yellow color filter. The light may be transmitted to the gate electrode via a light guide. The light guide may be on top of the gate electrode. The gate electrode may be part of a transfer gate, a reset switch, a select switch or a output transistor. The gate electrode may be thinner than a gate of a transistor in a periphery circuit outside the pixel array. The gate electrode may be made thinner by means of a wet etch. An etchant for thinning the gate electrode may be introduced through an opening in an insulating film on the substrate. The light guide may be formed in the opening after the thinning. An anti-reflection stack may be formed at a bottom of the opening prior to forming the light guide.

FIG. 7 illustrates an image sensor 10 comprising an array 12 of pixels 14 connected to a row decoder 20 by a group of control signals 22 and to a light reader circuit 1 by a output signals 18 output from the pixels 14. Light reader circuit samples the output signals 18 from pixels 14 and may perform subtraction and amplification on samples of the output signals 18. The pixel array 12 includes a color filter array that comprises color filters arrayed in two-dimensions, one color filter for each pixel 14.

Figures 4A, 4B:
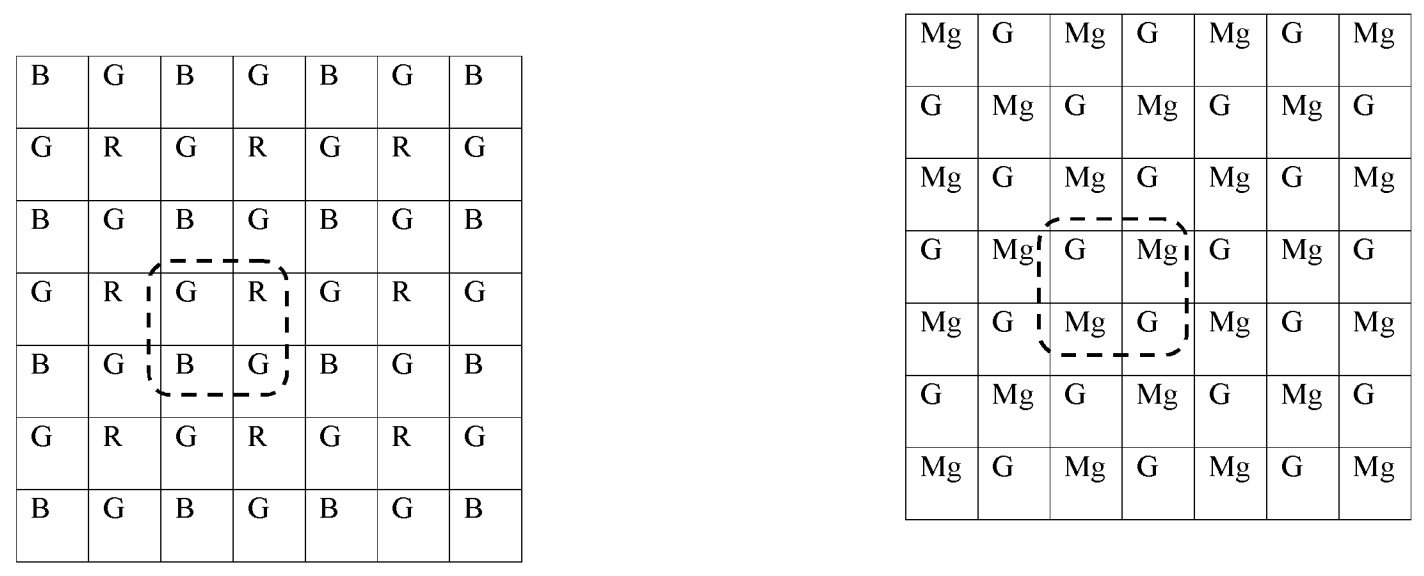

FIG. 4A illustrates an example of a color filter array that may be disposed over and as part of the pixel array 12. FIG. 4A shows a Bayer primary color filter pattern that comprises a repeated two-dimensional array of a two-by-two array of color filters each having one of a green color (G), a red color (R) and a blue color (B). A pair of green color filters is disposed along one diagonal of the two-by-two array. A pair of a red color filter and a blue color filter is disposed along the other diagonal. A red color filter has negligible transmittance for wavelength of light in air less than 600 nm. A green color filter has negligible transmittance for wavelength of light in air less than 500 nm or more than 600 nm. A blue color filter has negligible transmittance for wavelength of light in air more than 500 nm. A magenta color filter has negligible admittance for wavelength of light in air between 500 nm and 600 nm. A yellow color filter has negligible admittance for wavelength of light in air less than 500 nm. A transmittance is negligible if it is less than 10%. In each of the different color filters, peak transmittance should be in excess of 50%.

Figure 5:
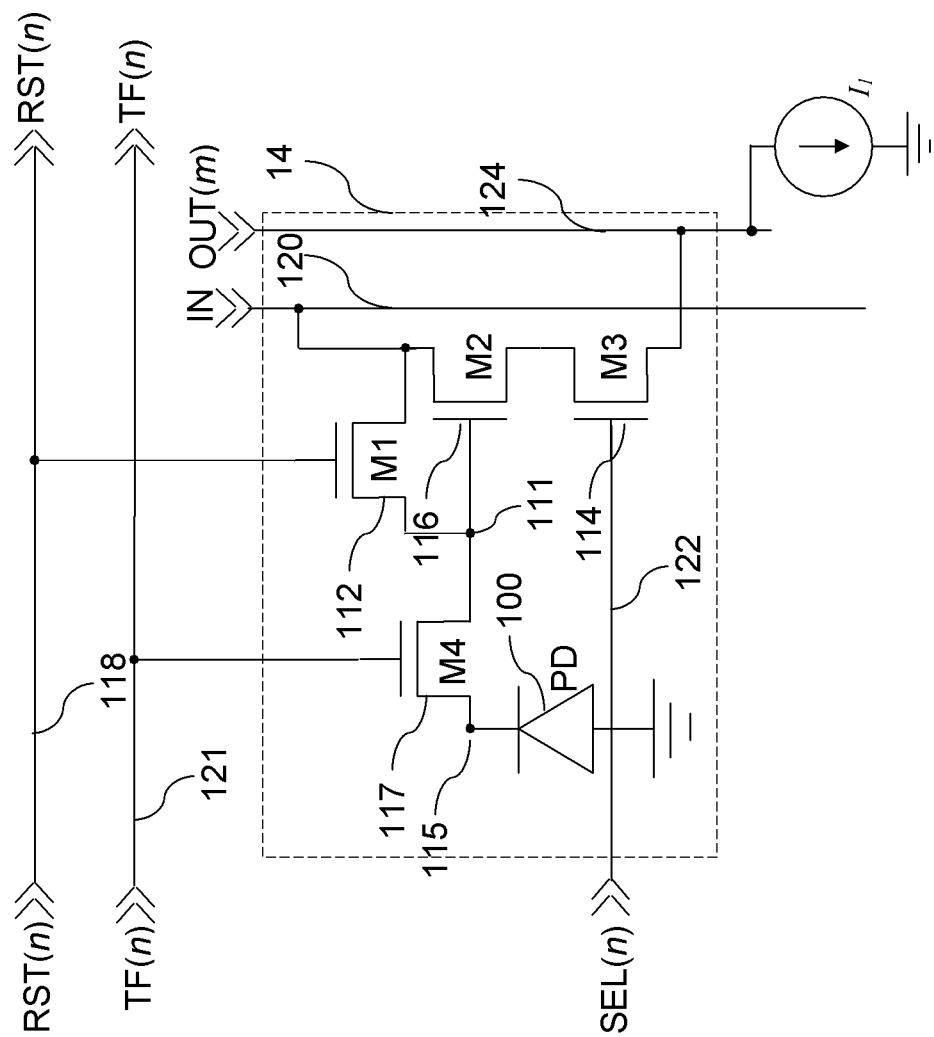
FIG. 5 is a schematic of a pixel having a photodiode and a transfer gate.

FIG. 5 shows a schematic for an embodiment of a pixel 14 of the pixel array 12. The pixel 14 includes a photodetector 100. By way of example, the photodetector 100 may be a photodiode. The photodetector 100 may be connected to a reset switch 112 via a transfer gate 117. The photodetector 100 may also be coupled to a select switch 114 through an output (i.e. source-follower) transistor 116. The transistors 112, 114, 116, 117 may be field effect transistors (FETs).

A gate of the transfer gate 112 may be connected to a TF(n) line 121. A gate of the reset switch 112 may be connected to a RST(n) line 118. A drain node of the reset switch 112 may be connected to an IN line 120. A gate of the select switch 114 may be connected to a SEL line 122. A source node of the select switch 114 may be connected to an OUT line 124. The RST(n) line 118, SEL(n) line 122, and TF(n) line 126 may be common for an entire row of pixels in the pixel array 12. Likewise, the IN 120 and OUT 124 lines may be common for an entire column of pixels in the pixel array 12. The RST(n) line 118, SEL(n) line 122 and TF(n) line 121 are connected to the row decoder 20 and are part of the control lines 22. The OUT(m) lines 124 are connected to the light reader 1 and are part of the vertical signal lines 18.

Figure 6:
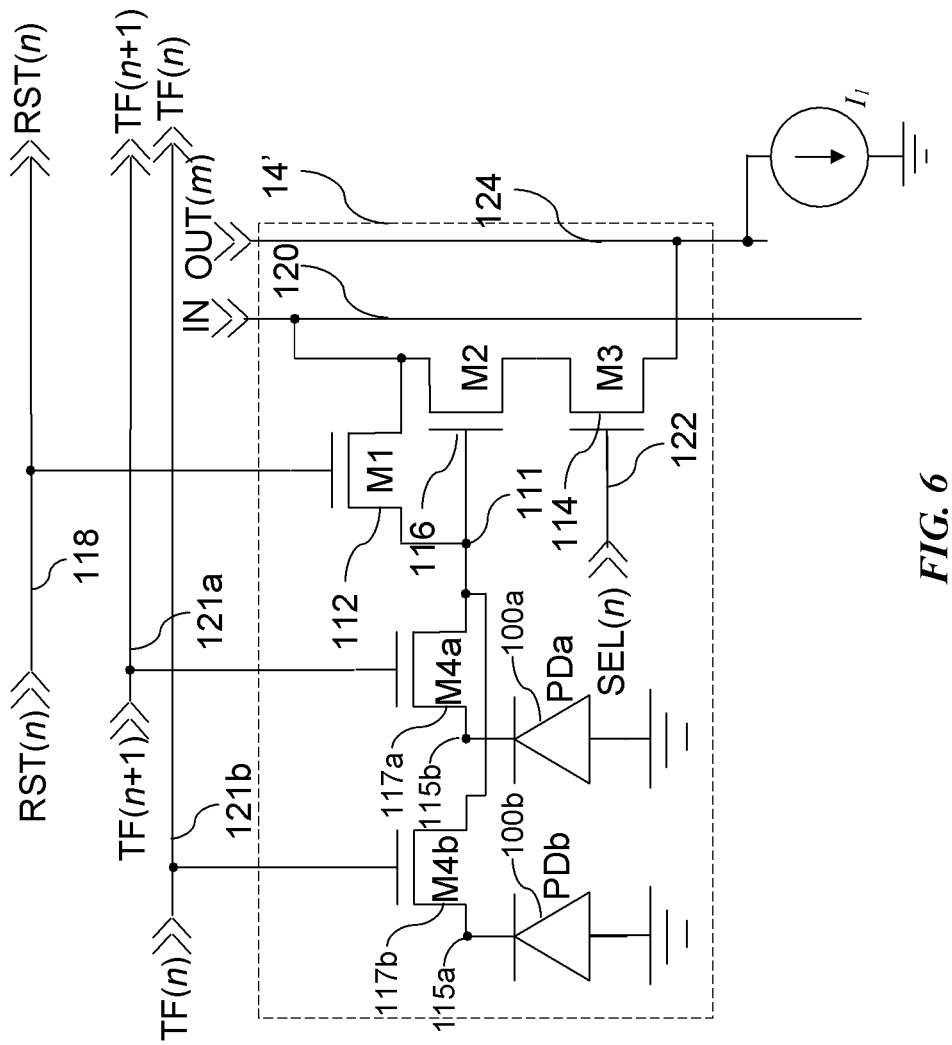
FIG. 6 is a schematic of an alternate embodiment of a pair of pixels each having a photodiode and a transfer gate.

FIG. 6 illustrates a pair of pixels sharing a reset switch 112, a select switch 114 and an output transistor 116. A photodetector 100a and a transfer gate 117a together form a first pixel within the pair. A photodetector 100b and a transfer gate 117b together form a second pixel within the pair. The first and second pixels may be located in different rows within the pixel array 12. The pixel pair includes two photodetectors 100a, 100b connected to a shared sense node 111 via transfer gates 117a, 117b, respectively. Transfer gates 117a, 117b are controlled by horizontal signals TF(n+1) 121a and TF(n) 121b, respectively, connected to their respective gates. A shared reset switch 112 connects the sense node 111 to the vertical IN line 120 under a control of a shared horizontal signal RST(n) 118 that is connected to a gate of the reset switch 112. The reset switch 112 and the transfer gate 117a when turned ON together and each into a triode region by driving both the signal RST(n) 118 and the signal TF(n+1) 121a high can reset the photodetector 100a to a voltage transmitted by the vertical IN signal 120. Likewise, the reset switch 112 and the transfer gate 117b when turned ON together and each into a triode region by driving both the signal RST(n) 118 and the signal TF(n) 121b high can reset the photodetector 100b to a voltage transmitted by the vertical IN signal 120. The RST(n) line 118, SEL(n) line 122 and TF(n+1) line 121a and TF(n) line 121b are connected to the row decoder 20 and are part of the control lines 22. The OUT(m) lines 124 are connected to the light reader 1 and are part of the vertical signal lines 18.

Referring to FIG. 6, an output transistor 116 is connected to a vertical OUT line 124 via a select transistor 114 turned ON by horizontal signal SEL(n) 122. The output transistor 116 and the select transistor 114 are shared among the two pairs of photodetectors 100a, 100b and transfer gates 117a, 117b. A signal can be transmitted from photodetector 100a to the vertical OUT line 124 by driving horizontal signals TF(n+1) 121a and SEL(n) 122. Likewise, a signal can be transmitted from photodetector 100b to the vertical OUT line 124 by driving horizontal signals TF(n) 121b and SEL(n) 122.

Figures 2, 3:
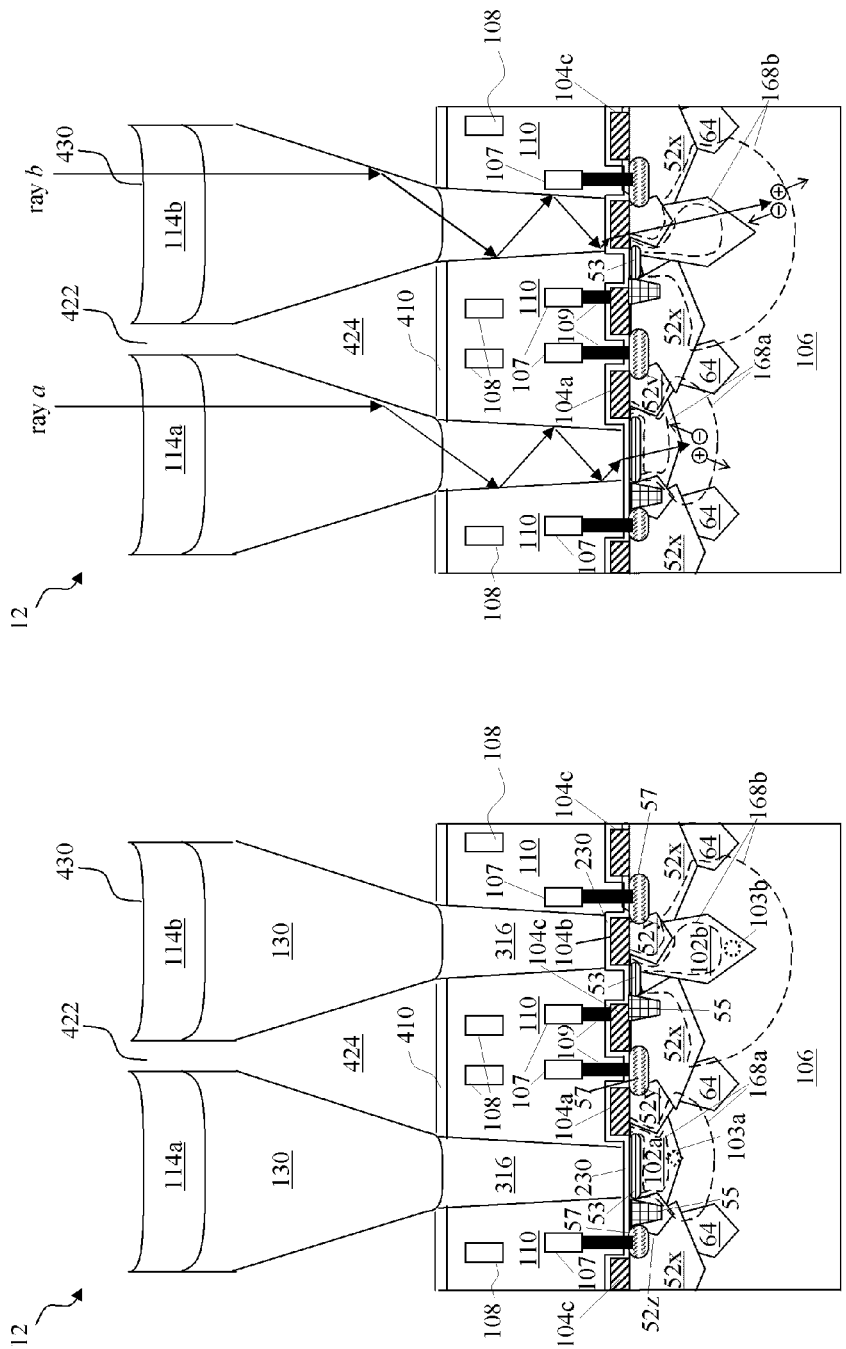
FIG. 2 is an illustration showing a cross-section of two image sensor pixels of an embodiment of the present invention.
FIG. 3 is an illustration showing ray traces within the pixels of FIG. 2.

FIG. 2 shows a sectional view of two pixels 14 of an embodiment of the image sensor of the instant invention where the pixels 14 each has a color filter 114a of a color or a color filter 114b of a different color. Two pixels are shown supported on a semiconductor substrate 106 in FIG. 2. The semiconductor substrate 106 may be a lightly doped semiconductor material of a first conductivity type, for example p-type. For example, substrate 106 may be of silicon doped with boron to the concentration between 1E15/cm$^3$ to 7E15/cm$^3$, such as a conventional p-epi layer on a heavily doped p+ substrate (not shown).

Referring to FIG. 2, each of the two pixels is for detection of a light of a different color, as determined by the color of light transmitted by color filters 114a, 114b, respectively. The color filter 114a has nonnegligible transmittance for light having a wavelength in air less than 500 nm, whereas the color filter 114b has negligible transmittance for light having a wavelength in air less than 500 nm. For example, the color filter 114a may be a blue color filter, or a magenta color filter, whereas the color filter 114b may be a red color filter or a green color filter or a yellow color filter.

Metal-2 wires 108 over the substrate 106 connect devices in the pixel array 12 with one another and/or with the row decoder 20 and/or light reader 1. Metal-1 wires 107 between the metal-2 wires 108 and the substrate 106 may connect between devices in the pixel 14, for example between a drain diffusion of one transistor to a polysilicon gate of another transistor, or between a device and a metal-2 wire. More wiring layers may be used. An insulating dielectric 110 above the substrate 106 supports metal-1 wires 107 and metal-2 wires 108. The insulating dielectric 110 may comprise a silicon oxide. A protection film 410 may cover the insulating dielectric 110 to keep out moisture and alkali metal ions such as sodium and potassium ions. The protection film 410 may comprise a silicon nitride.

Referring to FIG. 2, gate electrodes 104a, 104b, and 104c are each disposed on a gate dielectric (now shown) formed on the substrate 106. The gate dielectric insulates the gate electrodes 104a, 104b, 104c from the substrate 106. Gate electrodes 104a, 104b and 104c may comprise a polysilicon. Gate electrodes 104a, 104b are each part of a transfer gate, such as a transfer gate 117 shown in FIG. 5 or transfer gates 117a, 117b shown in FIG. 6. Gate electrode 104b is configured to be penetrated by a light having a wavelength in air greater than 500 nm, such as green light or red light, transmitted by the color filter 114b and passing through a lower light guide 316 above the gate electrode 104b. Gate electrodes 104c are each part of a non-transfer gate, for example any one of the reset transistor 112, source-follower transistor 116, and select transistor 114 shown in FIG. 5 or FIG. 6.

Referring to FIG. 2, lower light guides 316 and upper light guides 130 are light guides arranged in cascades to transmit visible lights from the color filters 114a, 114b. Light guides 316, 130 may comprise a silicon nitride, for example $Si_3N_4$. The lower light guide 316 on the right has a bottom on the gate electrode 104b to transmit light from the color filter 114b to the gate electrode 104b. Between the lower light guide 316 on the right and the gate electrode 104b may be sandwiched an anti-reflection stack to reduce a backwards reflection of the transmitted light at the interface between the lower light guide 316 and the gate 104b. For example, the anti-reflection stack may comprise three dielectric films (for example, oxide-nitride-oxide) or more. Each film has a thickness between 50 Angstroms and 2000 Angstroms optimized to reduce reflection for a range of light wavelengths transmitted by color filter 104b. The lower light guide 316 on the left is disposed laterally next to the gate electrode 104a to transmit light to the substrate 106 mostly without passing through the gate electrode 104a.

A first region 52y of the first conductivity type, such as p-type, is disposed under the gate oxide below the gate electrode 104b to form a bulk of a transistor that comprises the gate electrode 104b. The first region 52y below the gate electrode 104b, the gate electrode 104b itself, and a drain diffusion 57 adjacent to the gate electrode 104b together form parts of a transfer gate. The first region 52y may extend from a top interface of the substrate 106 below the gate electrode 104b to a depth of less than 0.8 μm if the color filter 114b is a red color filter, more preferably less than 0.45 μm, or to a depth of less than 0.5 μm if the color filter 114b is a green color filter or a yellow color filter, more preferably less than 0.35 μm. The depth of first region 52y may be shallower than conventional MOS transistors, such as ones found in the I/O cells in the periphery of the image sensor 10 or row decoder 20 or in ADC 24. The shallower depth for first region 52y reduces a vertical distance that light travels within the first region 52y. The first region 52y may be a retrograde well having peak doping concentration between 0.1 um to 0.2 um of depth, preferably 0.13 um. The first region 52y may comprise indium with peak dopant concentration between $5E17/cm^3$ to $5E18/cm^3$, preferably $3E18/cm^3$. A similar first region 52y may be formed below gate electrode 104a to form a bulk of the transfer gate that comprises gate electrode 104a.

The drain diffusion 57 may be a heavily doped region of a second conductivity type, such as n-type. For example, the drain diffusion 57 may comprise arsenic at a peak doping concentration of $1E20/cm^3$ or higher. The drain diffusion 57 may be a sense node such as the sense node 111 of FIG. 5 or FIG. 6.

Referring to FIG. 2, a second region 102b is disposed in the substrate 106 below the gate electrode 104b. The second region 102b is of the second conductivity type, for example n-type. A lateral portion of the second region 102b is disposed at the opposite end (from the drain diffusion 57) of the transfer gate that comprises the gate electrode 104b. The lateral portion of the second region 102b connects to a buried portion of the second region 102b that is buried under the first region 52y that is vertically below the gate electrode 104b. For example, the second region 102b may be formed by implanting phosphorus to form the lateral portion and the buried portion separately, each formed after one or the other of two separate masking steps. The peak doping concentration of the second region 102b may be between $1E17/cm^3$ to $7E18/cm^3$. A center 103b (shown as dotted circle in FIG. 2) of a horizontal section of the buried portion of the second region 102b may be vertically below the gate electrode 104b and may also be vertically below the first region 52y as shown in FIG. 2. A depletion region extends from below where the first region 52y has a peak doping concentration of the first conductivity type into a top of the buried portion of the second region 102b.

Referring to FIG. 2, unlike the second region 102b, a second region 102a connected to the transfer gate that comprises the gate electrode 104a has a center 103a (shown as dotted diamond shape in FIG. 2) of a horizontal section not vertically below the gate electrode 104a but beside. The second region 102a is of the second conductivity type, e.g. n-type, and may be formed by implanting phosphorus to a peak doping concentration between $1E16/cm^3$ and $7E18/cm^3$, more preferably between $7e16/cm^3$ and $7e17/cm^3$. When the transfer gate that comprises the gate electrode 104a turns ON, a channel forms below the gate electrode 104a to connect the second region 102a to the drain diffusion 57 that is adjacent to the gate electrode 104a and at the opposite end from the second region 102a. The drain diffusion 57 adjacent to the gate electrode 104a may be a sense node such as the sense node 111 of FIG. 5 or FIG. 6. The lower light guide 316 on the left is positioned to transmit light from the color filter 114a to the substrate 106 instead of through the gate electrode 104a. It is noted that a minor amount of light from the lower light guide may be transmitted to the gate electrode 104a but this should comprise less than 10% of the light transmitted by the lower light guide, such that the lower light guide 316 on the left is said to be mostly transmitting light to the substrate without passing through the gate electrode 114a.

The second regions 102a, 102b may be isolated from a top interface of the substrate by diffusions 53 beside the gate electrodes 104a, 104b having a first conductivity type, e.g. p-type, and a doping concentration between 5E17 to 1E19.

The best mode of the present mention has been described above.

An alternate embodiment of the image sensor of the instant invention may use no light guides 130 and 316 over second regions 102a and 102b but instead may use a conventional microlens and a color filter over each second region to focus light into the second region. In this alternate embodiment, a first microlens and a first color filter together transmit a light having a wavelength greater than 500 nm to the gate electrode 104b, whereas a second microlens and a second color filter together transmit a light having a wavelength within a range of 450 nm+/−50 nm to an area of top interface of the substrate 106 adjacent to but not covered by gate electrode 104a.

FIG. 3 is a ray tracing diagram for the sectional of the image sensor shown in FIG. 2. Ray a enters the color filter 114a and the light guide 130 on the left, reflects on sidewalls of the light guide 130 on the left, penetrates the second region 102a, is finally absorbed in the substrate within the depletion region 168a, whereupon an electron-hole pair is generated. An electron from the electron-hole pair is swept by the electric field in the depletion region 168a towards the second region 102a whereas a hole from the pair is repelled away into the substrate 106. The accumulated charge in the second region 102a thus becomes more negative. Or, a light may be absorbed in the second region 102a, whereupon an electron-hole pair is generated, from which a electron is held within the second region 102a whereas a hole is repelled by the electric field in the depletion region 168a outwards to the substrate 106. When the transfer gate that adjoins the second region 102a and that comprises gate electrode 104a is turned ON to form a conduction path, in this example an inversion layer in the channel at the surface of the substrate 106 below the gate electrode 104a, between the second region 102a and the drain diffusion 57 adjacent to the gate electrode 104a, the extent of accumulated negative charges is then sensed by an amplifier circuit such as shown in FIG. 5 or FIG. 6.

Referring to FIG. 3 again, ray b enters the color filter 114b and the light guide 130 on the right, reflects on sidewalls of the light guide 130 on the right, penetrates the anti-reflection stack 230, the gate electrode 104b and a gate-oxide beneath (not shown), penetrates the first region 52y, then penetrates the second region 102b, and is finally absorbed in the substrate within the depletion region 168b, whereupon an electron-hole pair is generated. An electron from the electron-hole pair is swept by the electric field in the depletion region 168b towards second region 102b whereas a hole from the pair is repelled away into the substrate 106. The accumulated charge in the second region 102b thus becomes more negative. When the transfer gate that adjoins the second region 102b and that comprises gate electrode 104b is turned ON to form a conduction path, in this example an inversion layer in the channel at the silicon surface below the gate electrode 104b, between the second region 102b and the n+ diffusion 57 adjacent to the gate electrode 104b, the extent of accumulated negative charges is then sensed by an amplifier circuit such as shown in a schematic of FIG. 5 or FIG. 6.

The color filter 114b may transmit a red light or a green light or both. The color filter 114b may be a green color filter, a red color filter, or a yellow color filter. Green and red lights have wavelengths between 500 nm and 700 nm and are able to penetrate more than 1 um through silicon and polysilicon before being absorbed. Light ray b having passed through color filter 114b is able to penetrate through the first region 52y to generate an electron-hole pair whose electron is collected by the second region 102b below the first region 52y.

As illustrated in FIG. 3, the light ray b penetrates beyond the second region 102b and generates an electron-hole pair within a depletion region that surrounds the second region. Also, a light ray that passes through the color filter 114b may be absorbed in the second region 102b itself, generating an electron-hole pair whose electron is retained in the second region 102b whereas the hole from the pair is repelled out to the substrate 106 by the electric field within the depletion region 168b. Or, a light ray that passes through the color filter 114b may be absorbed in the first region 52y, creates an electron-hole pair whose electron diffuses into the depletion region 168b and is swept by the electric field therein into the second region 102b.

In an alternate embodiment, to reduce an amount of light absorbed in the gate electrode 104b, the gate electrode 104b may be made thinner, at least over a portion under the lower light guide 316, than gate electrode of a different transistor, for example a transistor outside the pixel array 12 such as one in the ADC 24. For example, a conventional polysilicon gate may have a thickness about 2,000 Angstrom+/−10%. The gate electrode 104b may comprise a polysilicon. It may be made to be between 200 Angstroms and 1,000 Angstroms thick, preferably between 300 Angstroms and 700 Angstroms, more preferably within 500+/−50 Angstroms. The gate electrode 104b may be etched down from the above using wet etch after the drain diffusion 57 is already formed. An insulating film 110, such as a silicon oxide film, may be deposited over the wafer, followed by a lithography step to form a photoresist mask over the wafer to just expose areas on the insulating film 110 above where gates are to be thinned, e.g. just over areas of transfer gates in the pixel array 12 where lower light guides 316 will overlap with, followed by a wet etch to form an opening to expose the top of gates, then finally a wet etch to etch the gate (e.g. polysilicon gate) down to the desired final thickness. The lithography step may be preceded by a planarization of the silicon oxide film by CMP.

As an alternative to the wet etch, a plasma etch on the insulating film 110 may be applied to form part of the opening followed by a wet etch to remove the residual thickness of the insulating film 110, etching the opening through the insulating film 110 and exposing the upper areas of gates. Alternately, the entire thickness of the insulating film 110 may be etched through by plasma etch alone, not involving wet etch, to create the opening. The thinning of the gate 104b may be performed after a lightly-doped drain (LDD) implant for transistors in the ADC 24 and/or the row decoder 20.

The opening may also be an opening into which lower light guide 316 is subsequently formed, e.g. by depositing a silicon nitride. An anti-reflection stack, such as an oxide-nitride-oxide stack comprising a lower oxide film, a middle nitride film and a top oxide film, may be deposited to the bottom of the opening prior to forming the lower light guide 316 in the opening.

Figure 9A:
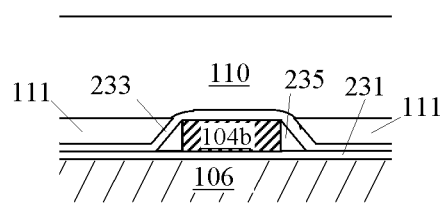
FIGS. 9A to 9E are illustration of a process to thin a gate under a light guide according to an aspect of the present invention.

FIG. 9A to 9E illustrates a process for forming an opening 120 over the gate 104b (or 104d), thinning the gate 104b (or 104d), forming an anti-reflection stack on the gate 104b (or 104d), and forming lower light guide 316 in the opening 120. FIG. 9A shows the gate 104b on a gate oxide 231 on the substrate 106. The gate 104b is flanked by spacers 235. The gate 104b and spacers 235 and portions of the gate oxide 231 not under the gate 104b or the spacers 235 are covered by a film of nitride liner 233. An insulating film 111 covers the wafer to a similar height as the top of the gate 104b. Insulating film 111 may be a silicon oxide doped with boron and phosphorus, such as BPSG. The insulating film 110 further covers the wafer above the insulating film 111 and the portion of the nitride liner 233 atop the gate 104b. Metal wiring layers may or may not have been formed in the insulating film 110 at this point. The insulating film 110 may comprise a silicon oxide.

Figure 9B:
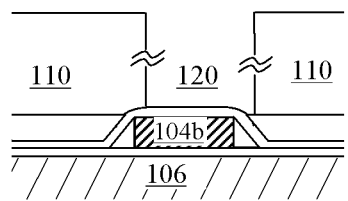
Figure 9C:
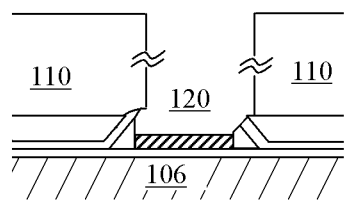

FIG. 9B shows an opening 120 made through the insulating film 110 and exposes a portion of the nitride liner 233 above the gate 104b. The opening 120 made be formed by plasma etch alone, or may be formed by a plasma etch followed by a wet edge. In FIG. 9C, the portion of the nitride liner 233 is removed, and the gate 104b is etched down from above to result in a thinner gate of the desired thickness.

Figure 9D:
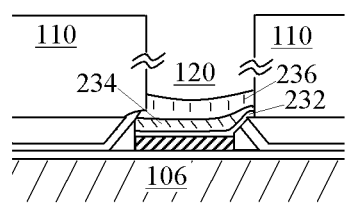
Figure 9E:
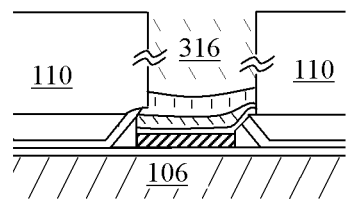

FIG. 9D shows an anti-reflection stack comprising three films 232, 234, 236 are formed on the thinned gate 104b at the bottom of the opening 120. Top anti-reflection film 236 may comprise a silicon oxide. The second anti-reflection film 234 may comprise a silicon nitride. The third anti-reflection film 232 may comprise a silicon oxide. The anti-reflection stack reduces a backward reflection of light transmitted from the light guide 316 to the substrate 106. FIG. 9E shows light guide 316 is formed in the opening 120 after the anti-reflection stack.

FIG. 4B illustrates another example of a color filter array that may be disposed over and as part of the pixel array 12. FIG. 4B shows a green-magenta color filter pattern that comprises a repeated two-dimensional array of a two-by-two array of color filters each having one of a green color (G) and a magenta color (Mg). A pair of green color filters is disposed along one diagonal of the two-by-two array. A pair of a magenta color filters is disposed along the other diagonal. In a pixel array that incorporates the green-magenta color filter array, the green pixel (having the green color filter as color filter 114b) may be formed in the manner of the pixel on the right in FIG. 2. The magenta pixel (having the magenta color filter as color filter 114a) may be formed similar to the manner of the pixel on the left in FIG. 2, in addition to having an additional photodetector below the second region 102a and an additional transfer gate to transfer charges from this additional photodetector.

Figure 8:
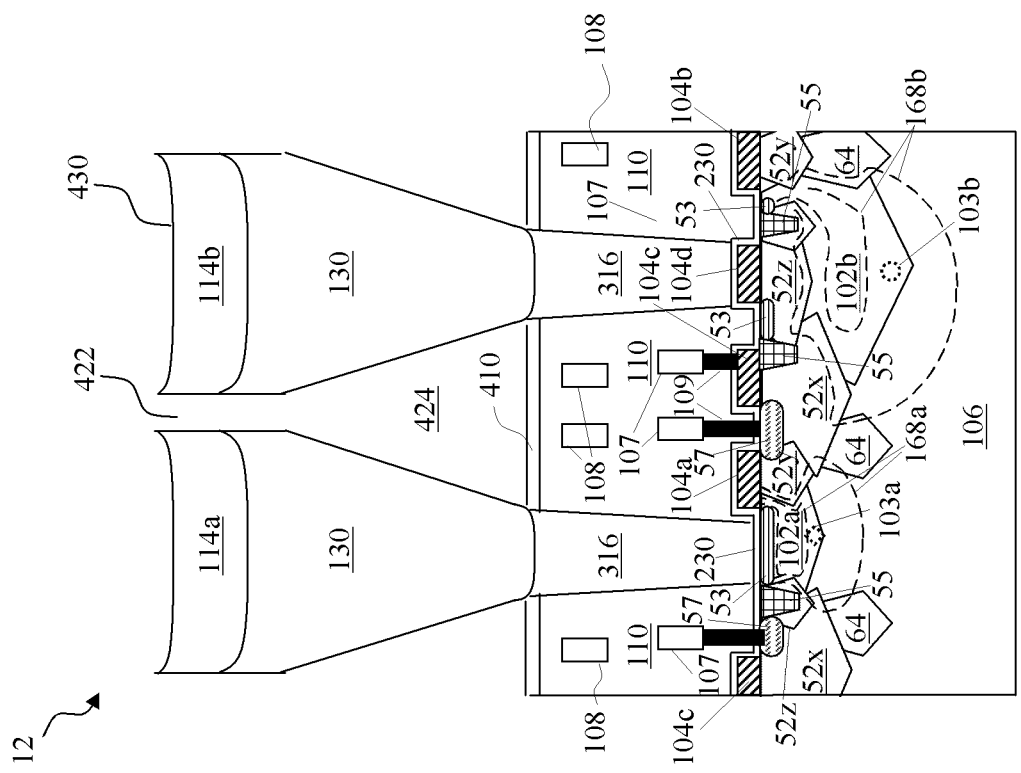
FIG. 8 is an illustration showing a cross-section of two image sensor pixels of an alternate embodiment of the present invention.

FIG. 8 shows an alternate embodiment modified from the embodiment shown in FIG. 2. The bottom portion of a second region 102b of FIG. 2 is modified for a red pixel or a green pixel or a yellow pixel by extending the second region 102b under a Pwell 52z of a transistor having a gate 104d above the second region 102b and the Pwell 52z. The transistor is not a transfer transistor 117 and may be one of the reset switches 112 and the select switches 114 and the output transistors 116. The lower light guide 316 of the pixel overlaps the gate 104d of the transistor to transmit light through the gate 104d and the Pwell 52z to the second region 102b.

The Pwell 52z may extend from a top interface of the substrate 106 below the gate electrode 104d to a depth of less than 0.8 μm if the color filter 114b is a red color filter, more preferably less than 0.45 μm, or to a depth of less than 0.5 μm if the color filter 114b transmits is a green color filter or a yellow color filter, more preferably less than 0.35 μm. The depth of Pwell 52z may be shallower than conventional MOS transistors, such as ones found in the I/O cells in the periphery of the image sensor 10 or row decoder 20 or in ADC 24. The shallower depth for Pwell 52z reduces a vertical distance that light travels within the Pwell 52z. The Pwell 52z may be a retrograde well having peak doping concentration between 0.1 um to 0.2 um of depth, preferably 0.13 um. The Pwell 52z may comprise indium with peak dopant concentration between $5E17/cm^3$ to $5E18/cm^3$, preferably $3E18/cm^3$.

The gate 104d is preferably made thinner as described above. It is further desirable that the gate 104d satisfies one of the thickness limitations described above with respect to the thinner gate. It is also further desirable that the gate 104d is thinned according to one of the methods described above for gate thinning.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A pixel array of an image sensor supported by a substrate of a first conductivity type, comprising:
    a first pixel configured to detect a blue light; and,
    a second pixel, the second pixel comprises:
        a photodetector that comprises a second region of a second conductivity type in the substrate;
        a first region of the first conductivity type being vertically above the second region and under a top interface of the substrate;
        a first drain of a first transistor, the first drain abutting the first region;
        a first gate of the first transistor, the first gate being vertically above the first and second regions;
        a first color filter, the first color filter being a red color filter or a green color filter or a yellow color filter; and,
        a first light guide, the first light guide being configured to transmit a light from the first color filter to the second region via the first gate and the first region.

2. The pixel array of claim 1, wherein the first transistor is a select switch or a reset switch or an output transistor.

3. The pixel array of claim 1, wherein the first transistor is a transfer gate.

4. The pixel array of claim 1, wherein the first light guide uses total internal reflection at its sidewalls to prevent the light from exiting laterally.

5. The pixel array of claim 1, wherein the first gate has a thickness between 200 Angstroms and 1,000 Angstroms.

6. The pixel array of claim 1, wherein the first gate has a thickness between 300 Angstroms and 700 Angstroms.

7. The pixel array of claim 1, wherein the first gate has a thickness within 500+/−50 Angstroms.

8. The pixel array of claim 1, wherein the first gate is thinner than a gate of a transistor in an analog-to-digital converter in the image sensor.

9. The pixel array of claim 1, the first pixel comprising:
    a second color filter, the second color filter being a blue color filter or a magenta color filter; and,
    a second light guide configured to transmit a light from the second color filter to the substrate mostly without passing through a gate of a transistor.

10. The pixel array of claim 1, wherein the first region is not deeper than 0.8 um in the substrate where the first color filter is a red color filter, and is not deeper than 0.5 um in the substrate if the first color filter is a green color filter or a yellow color filter.

11. The pixel array of claim 1, wherein the first region is not deeper than 0.5 um in the substrate where the first color filter is a red color filter, and is not deeper than 0.35 um in the substrate if the first color filter is a green color filter or a yellow color filter.

12. The pixel array of claim 1, wherein the first conductivity type is p-type and the second conductivity type is n-type.

13. A method for forming a pixel array of an image sensor supported by a substrate of a first conductivity type, comprising:
    forming a second region of a second conductivity type in the substrate;
    forming a first region of the first conductivity in the substrate and vertically above the second region;
    forming a drain of a transistor in the substrate, the drain abutting the first region;
    forming a gate of the transistor above the substrate, the gate being vertically above the first region and adjacent to the drain;
    forming a color filter, the color filter being a red color filter or a green color filter or a yellow color filter; and,
    forming a light guide, the light guide being configured to transmit a light from the color filter to the second region via the gate and the first region.

14. The method of claim 13, further comprising:
    thinning the gate in a dimension perpendicular to the substrate.

15. The method of claim 14, wherein, after the thinning, the gate has a thickness between 200 Angstroms and 1,000 Angstroms.

16. The method of claim 14, wherein, after the thinning, the gate has a thickness between 300 Angstroms and 700 Angstroms.

17. The method of claim 14, wherein after the thinning the gate has a thickness within 500+/−50 Angstroms.

18. The method of claim 14, wherein the gate is thinned by an etching in which an etchant is introduce through an opening through an insulation film over the gate, the light guide being subsequently formed in the opening.

19. The method of claim 18, further comprising:
    forming an anti-reflection stack in the opening after the thinning and before forming the light guide.

20. The method of claim 14, wherein the thinning is performed through a wet etch.

21. The method of claim 18, wherein the opening is opened with a plasma etch first then followed by a wet etch.

22. The method of claim 13, wherein the first conductivity type is p-type, and the second conductivity type is n-type.

23. The pixel array of claim 1, wherein the first light guide is disposed on the first gate.

24. The pixel array of claim 1, wherein the substrate is covered by an insulating film and the light guide is embedded in the insulating film.

* * * * *